US012568844B2

(12) United States Patent
Ho et al.

(10) Patent No.: US 12,568,844 B2
(45) Date of Patent: Mar. 3, 2026

(54) WAFER-LEVEL-PACKAGE DEVICE WITH PERIPHERAL SIDE WALL PROTECTION

(71) Applicant: PANJIT INTERNATIONAL INC., Kaohsiung City (TW)

(72) Inventors: Chung-Hsiung Ho, Kaohsiung City (TW); Wen-Liang Huang, Kaohsiung City (TW); Jeng-Sian Wu, Taoyuan City (TW)

(73) Assignee: PANJIT INTERNATIONAL INC., Kaohsiung City (TW)

( * ) Notice: Subject to any disclaimer, the term of this patent is extended or adjusted under 35 U.S.C. 154(b) by 421 days.

(21) Appl. No.: 18/179,648

(22) Filed: Mar. 7, 2023

(65) Prior Publication Data

US 2024/0274484 A1 Aug. 15, 2024

(30) Foreign Application Priority Data

Feb. 10, 2023 (TW) ................................. 112104808

(51) Int. Cl.
| | |
|---|---|
| *H01L 23/31* | (2006.01) |
| *H01L 21/56* | (2006.01) |
| *H01L 21/683* | (2006.01) |
| *H01L 21/78* | (2006.01) |
| *H01L 23/00* | (2006.01) |
| *H10D 62/10* | (2025.01) |

(52) U.S. Cl.
CPC ........ *H01L 23/3114* (2013.01); *H01L 21/561* (2013.01); *H01L 21/568* (2013.01); *H01L 21/6836* (2013.01); *H01L 21/78* (2013.01); *H01L 24/05* (2013.01); *H10D 62/117* (2025.01); *H01L 24/03* (2013.01); *H01L 24/95* (2013.01); *H01L 2221/68327* (2013.01); *H01L*

*2224/0381* (2013.01); *H01L 2224/05571* (2013.01); *H01L 2224/05572* (2013.01); *H01L 2224/95001* (2013.01)

(58) Field of Classification Search
CPC . H01L 23/3114; H01L 21/561; H01L 21/568; H01L 21/6836; H01L 21/78; H01L 24/05; H01L 24/03; H01L 24/95; H01L 2221/68327; H01L 2224/0381; H01L 2224/05571; H01L 2224/05572; H01L 2224/95001; H01L 24/13; H10D 62/117
See application file for complete search history.

(56) References Cited

U.S. PATENT DOCUMENTS

| | | | |
|---|---|---|---|
| 2016/0225733 A1* | 8/2016 | Wilcoxen | ................ H01L 24/14 |
| 2017/0077007 A1* | 3/2017 | Suthiwongsunthorn | ..................... H01L 21/3105 |

FOREIGN PATENT DOCUMENTS

| | | |
|---|---|---|
| TW | 201415681 A | 4/2014 |
| TW | 201719780 A | 6/2017 |
| TW | 201810397 A | 3/2018 |

\* cited by examiner

*Primary Examiner* — Thanh T Nguyen
(74) *Attorney, Agent, or Firm* — Rosenberg, Klein & Lee

(57) ABSTRACT

A wafer-level-package device with peripheral side wall protection has a die, multiple conductive bumps, and a protection layer. The die has a top surface, a bottom surface, and a peripheral side wall. A cavity is formed on the peripheral side wall of the die and around the die. The multiple conductive bumps are mounted on at least one of the top surface and the bottom surface of the die. The protection layer covers the die, the cavity, and the multiple conductive bumps. The multiple conductive bumps are exposed from the protection layer.

6 Claims, 20 Drawing Sheets

WAFER-LEVEL-PACKAGE DEVICE WITH PERIPHERAL SIDE WALL PROTECTION

CROSS REFERENCE TO RELATED APPLICATIONS

The present application claims priority to Taiwan application No. 112104808, filed on Feb. 10, 2023, the content of which is hereby incorporated by reference in its entirety.

BACKGROUND OF THE INVENTION

1. Field of the Invention

The present invention relates to a semiconductor device, and more particularly to a wafer-level-package device with peripheral side wall protection.

2. Description of Related Art

A conventional manufacturing process of a die of a semiconductor device is disclosed herein. After integrated circuits and conductive bumps 41 are formed on a wafer 40 as shown in FIG. 9A, the wafer 40 will be inverted as shown in FIG. 9B. The bottom surface of the wafer 40 can be grinded to modify the thickness of the wafer 40. Then, the wafer 40 will be sawed by a wafer dicing blade along scribe lines to get multiple singulated dies 42 as shown in FIG. 9C and FIG. 9D.

However, the surface of each die 42 as well as its conductive bumps 41 are entirely exposed to surroundings. That will cause high risk of damages on the die and the conductive bumps. For example, the multiple singulated dies 42 will be transferred to several processing stations of a production line. During the transfer trip, the dies 42 may collide with each other or collide with other objects. As a result, with reference to FIG. 9E, the die 42 may split to have cracks 43 and get damaged.

SUMMARY OF THE INVENTION

The conventional dies diced from the wafer and their conductive bumps are entirely exposed to surroundings, causing high risk of damages on the dies and their conductive bumps. In order to overcome the problem, an objective of the present invention is to provide a wafer-level-package device with peripheral side wall protection.

The wafer-level-package device of the present invention comprises a die, multiple conductive bumps, and a protection layer. The die has a top surface, a bottom surface, and a peripheral side wall. A cavity is formed on the peripheral side wall of the die and around the die. The multiple conductive bumps are mounted on at least one of the top surface and the bottom surface of the die. The protection layer covers the die, the cavity, and the multiple conductive bumps. The multiple conductive bumps are exposed from the protection layer.

In the wafer-level-package device of the present invention, the protection layer covers the die, the cavity, and the conductive bumps. Compared with the die as mentioned in the foregoing related art, the die and the conductive bumps of the present invention are covered by the protection layer and are not entirely exposed to surroundings. The protection layer can absorb and buffer the collision or shock from surroundings, so as to greatly reduce the risk of damages on the die and the conductive bumps. The problem as mentioned in the foregoing related art is overcome. In addition, the cavity is formed on the peripheral side wall of the die and around the die. Namely, the cavity is included in the peripheral side wall. So the surface of the peripheral side wall is not an entirely flat plane. The contact area between the protection layer and the die is enlarged. Therefore, the combination of the protection layer and the die is much more stable due to the structure of the protection layer covering the cavity.

BRIEF DESCRIPTION OF THE DRAWINGS

FIGS. 1A to 1L are schematic diagrams showing a first embodiment of a packaging process of the wafer-level-package device of the present invention;

DETAILED DESCRIPTION OF PREFERRED EMBODIMENT(S)

After the semiconductor configuration of integrated circuits are formed on a wafer, a packaging process is then performed on the wafer, which is known as wafer level packaging (WLP). Afterwards, a singulation process is performed on the wafer to obtain multiple wafer-level-package devices (hereinafter referred to as WLP devices). The structures as well as the packaging processes of the WLP device with peripheral side wall protection of the present invention are described below.

Figure 1A:
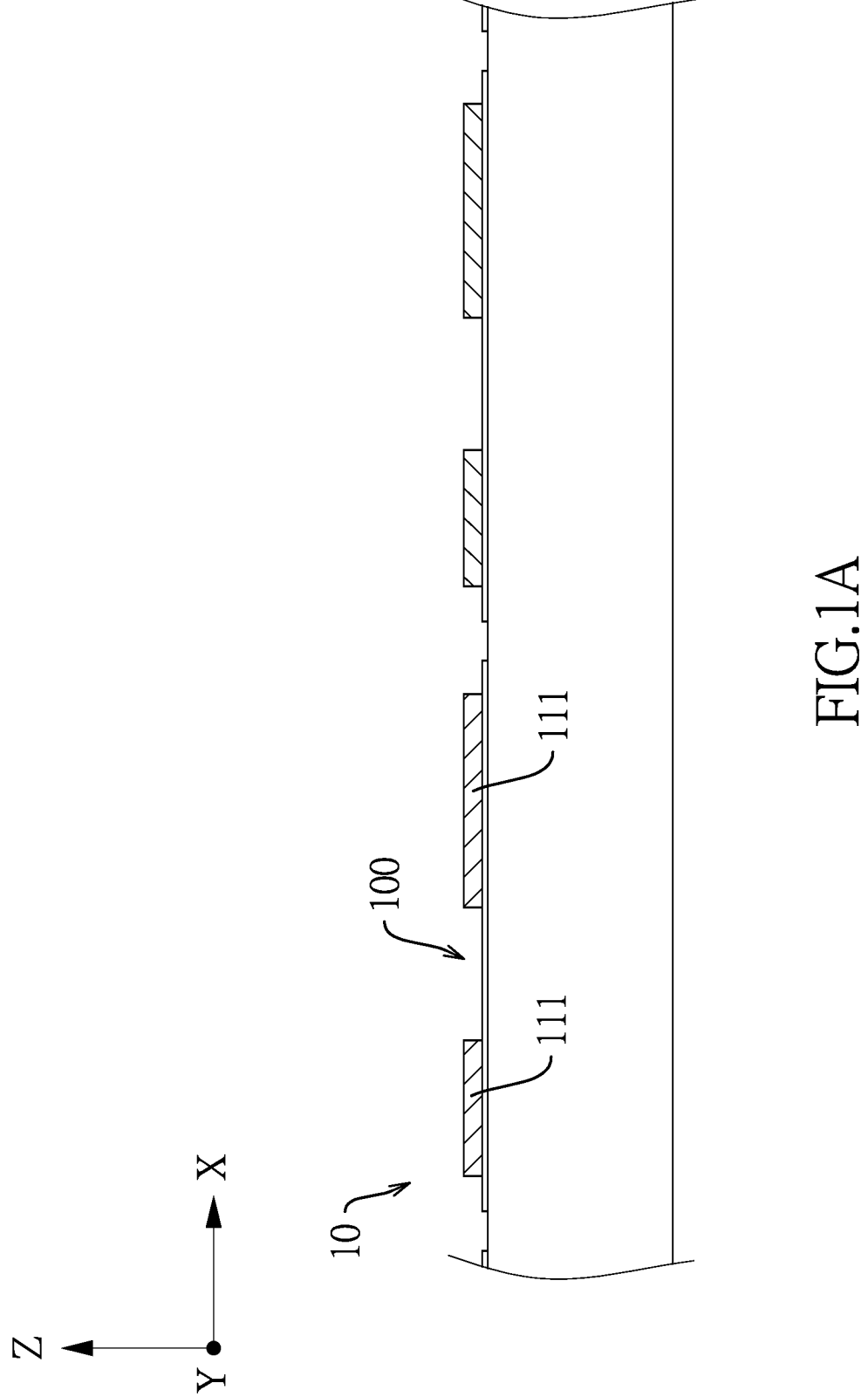
Figure 1B:
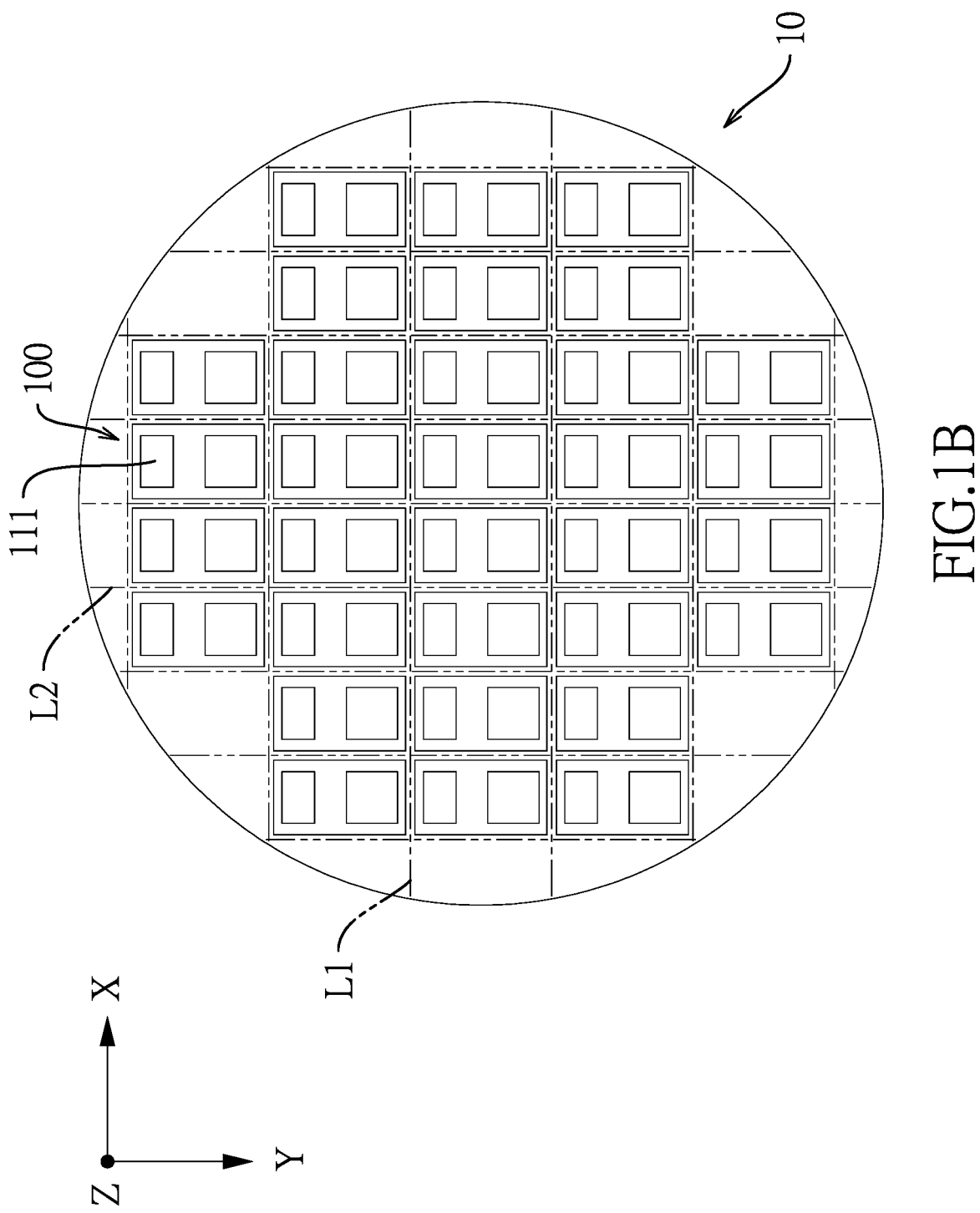

1. First Embodiment of the Packaging Process of the WLP Device of the Present Invention With reference to FIG. 1A and FIG. 1B, a wafer 10 is prepared. The wafer 10 has undergone a variety of semiconductor processes to have integrated circuits of multiple semiconductor units 100. For example, the semiconductor unit 100 may have the integrated circuit of a semiconductor device such as a diode, a transistor, and so on. Conductive bumps 111 are mounted on a top surface of the wafer 10 and respectively corresponding to the semiconductor units 100. For conciseness in description, an X-Y-Z Cartesian coordinate system is depicted in FIG. 1A and FIG. 1B. The positions of the semiconductor units 100 are formed in an array arrangement on the X-Y plane. Multiple X-axis scribe lines L1 and multiple Y-axis scribe lines L2 are defined on the surface of the wafer 10. Any one of the semiconductor units 100 is located within a region enclosed by two adjacent X-axis scribe lines L1 and two adjacent Y-axis scribe lines L2.

Figures 1C, 1D:
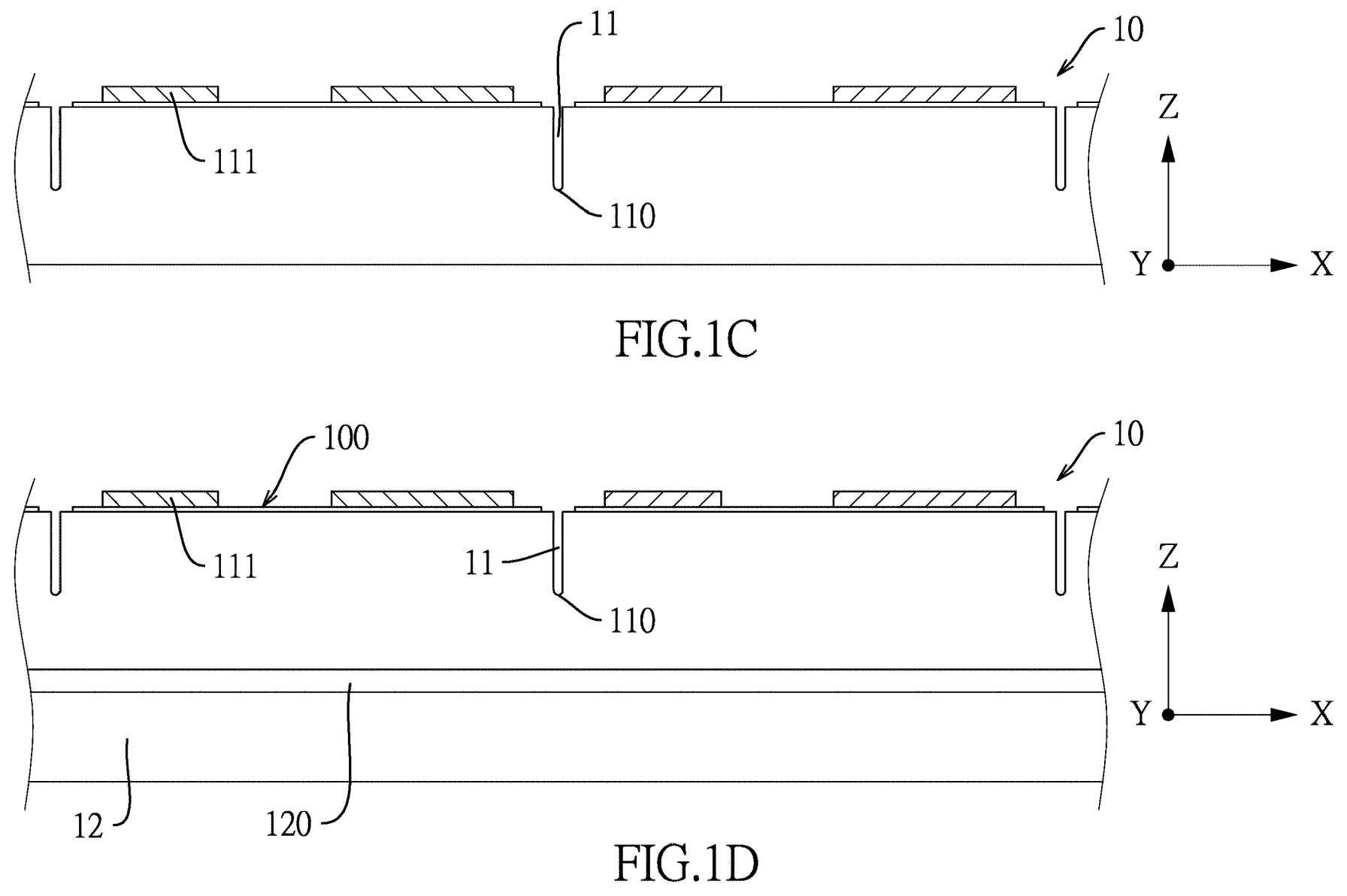

With reference to FIG. 1C and FIG. 1B, multiple first grooves 11 are formed on the top surface of the wafer 10 by sawing the top surface of the wafer 10 along the X-axis scribe lines L1 and the Y-axis scribe lines L2. The first grooves 11 extend along the X-axis and the Y-axis respectively and cut across each other. So, the distribution of the first grooves 11 as a whole on the top surface of the wafer 10 is in a grid pattern. A vertical sawing depth (along the Z-axis) of each first groove 11 is a preset value. For example, the vertical sawing depth of the first groove 11 may be, but not limited to, a half of the thickness of the WLP device. As shown in FIG. 1C, the first grooves 11 are not formed through the wafer 10. In other words, each first groove 11 has a bottom surface 110 located within the wafer 10. In the present invention, a wafer dicing blade could be used to saw the wafer 10 to form the first grooves 11, such that the shape of a groove surface of the first groove 11 corresponds to the shape of a cutting surface of the wafer dicing blade. In addition, the method to form the first grooves 11 is not limited to the use of the wafer dicing blade. For example, the first grooves 11 could be formed by etching, laser, and so on.

With reference to FIG. 1D, the bottom surface of the wafer 10 is attached on a tape 120 of a first carrier board 12.

Figures 1E, 1F:
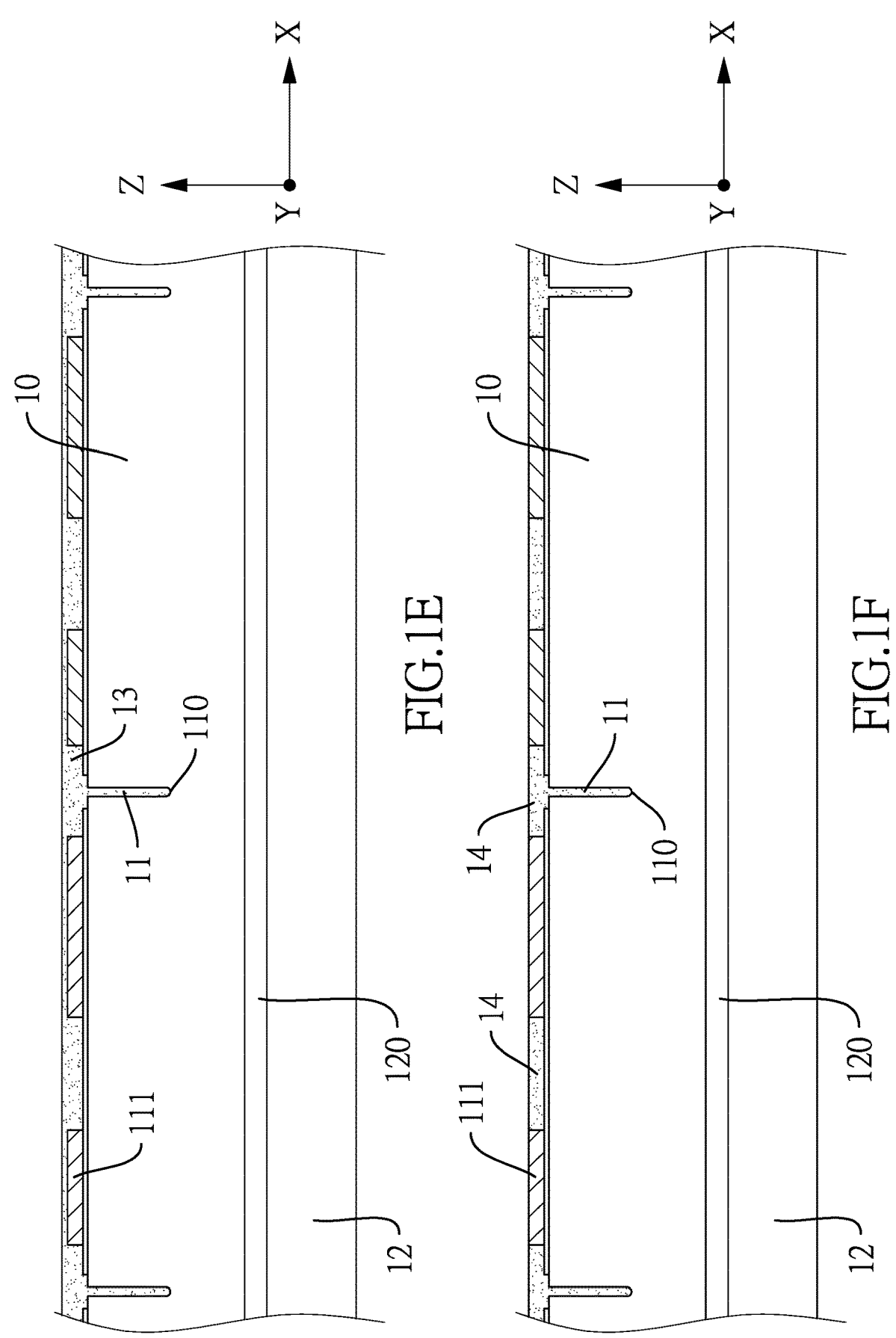

With reference to FIG. 1E, the first grooves 11 of the wafer 10 are filled with resin 13. Besides, the resin 13 is also formed on the top surface of the wafer 10 and the top surfaces of the conductive bumps 111. The resin 13 can be formed by film-laminating, printing, coating, dispensing, and so on. After the resin 13 is solidified, the resin 13 will be grinded from the top surface of the resin 13 until the top surfaces of the conductive bumps 111 are exposed from the resin 13. Then, impurities are removed from the top surfaces of the conductive bumps 111 by plasma or laser. Therefore, the resin 13 as shown in FIG. 1E becomes an upper encapsulant layer 14 as shown in FIG. 1F. The top surface of the upper encapsulant layer 14 is flush with the top surfaces of the conductive bumps 111.

Figures 1G, 1H:
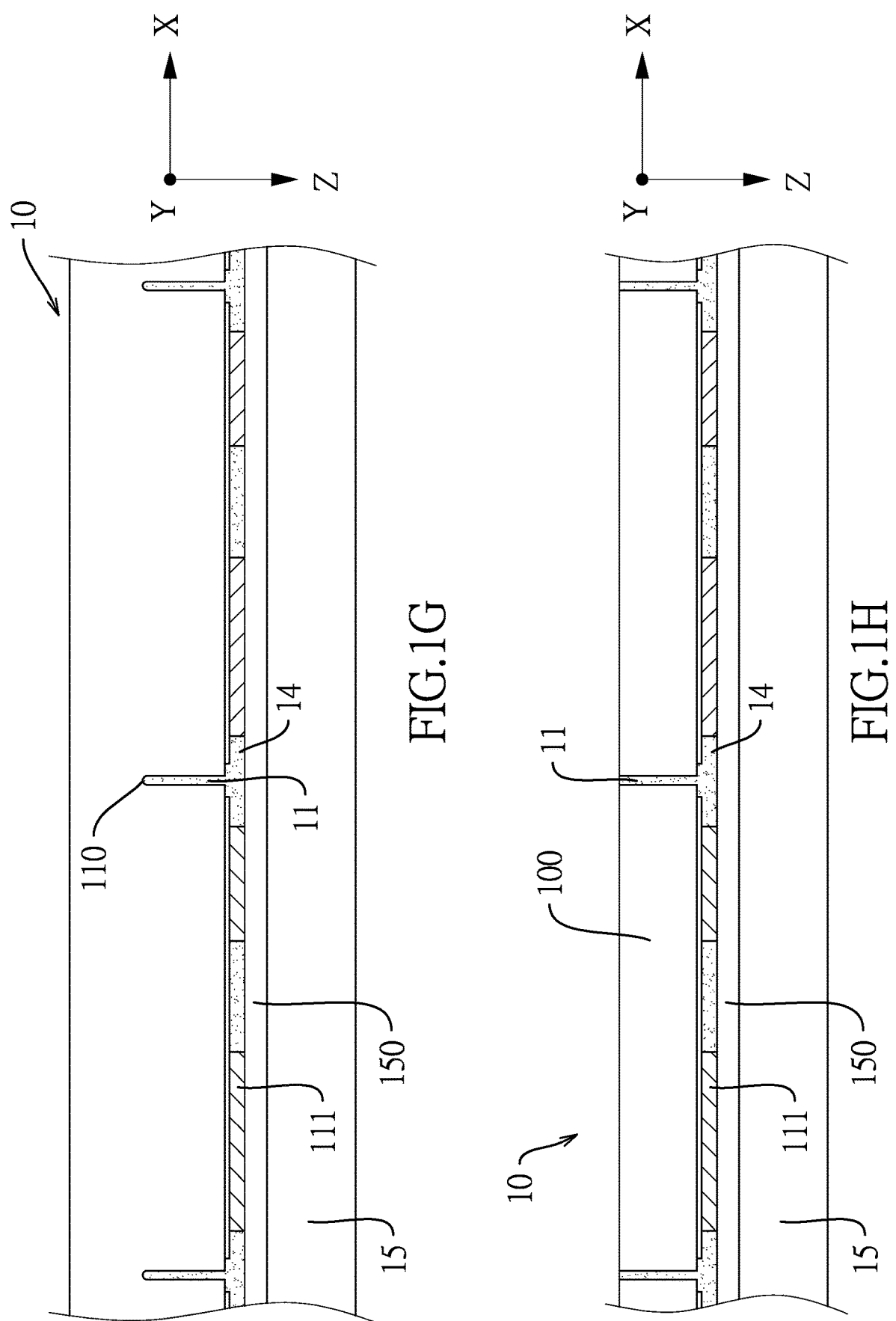

Then, the first carrier board 12 is detached from the wafer 10 via the tape 120. With reference to FIG. 1G, the wafer 10 is inverted, and the top surfaces of the conductive bumps 111 and the top surface of the upper encapsulant layer 14 are attached on a tape 150 of a second carrier board 15.

With reference to FIG. 1H, the bottom surface of the wafer 10 is grinded until parts of the upper encapsulant layer 14 filled in the first grooves 11 are exposed from bottom surface of the wafer 10. At that time, the semiconductor units 100 are separated from each other. So each semiconductor unit 100 is as a die.

Figures 1I, 1J:
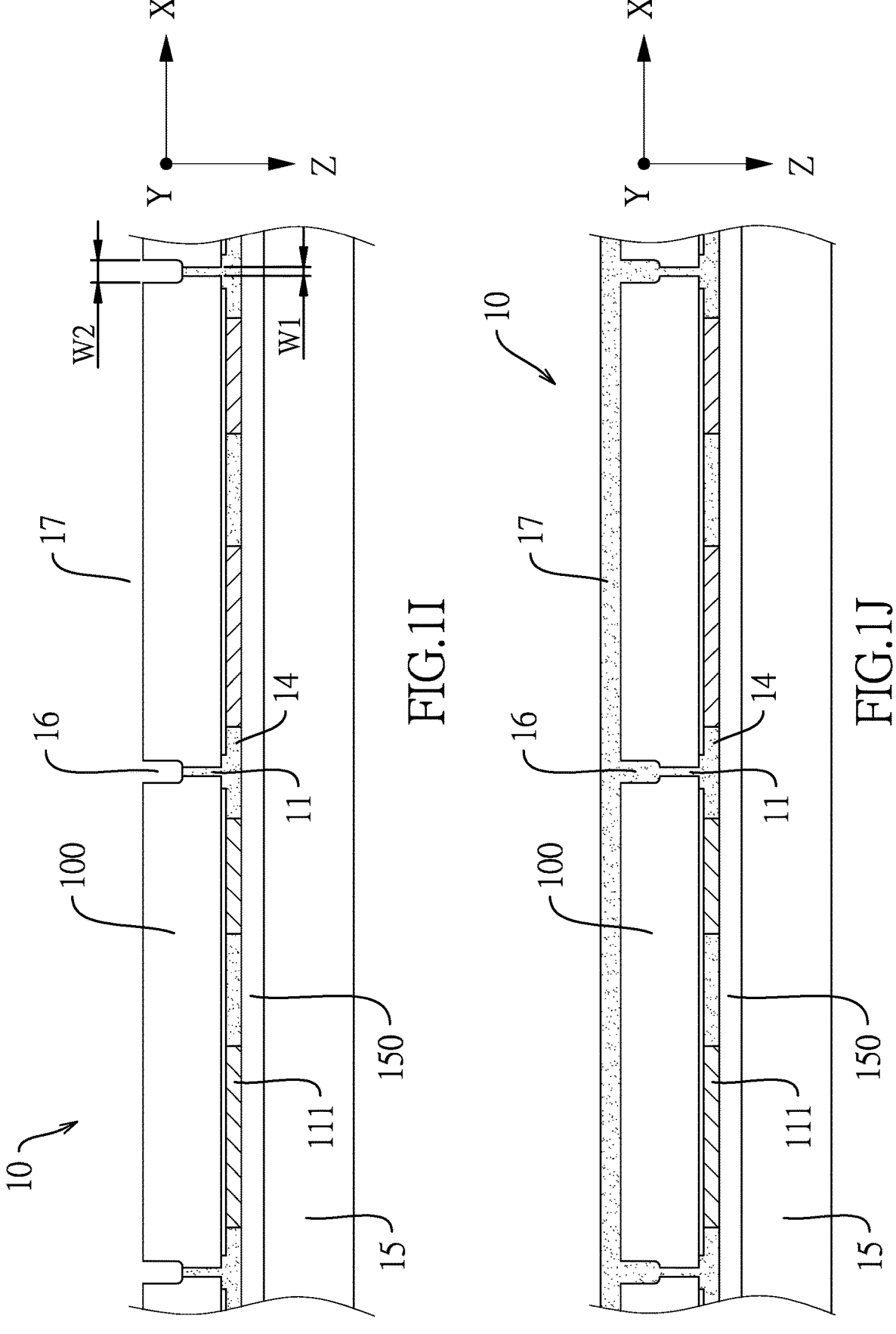

With reference to FIG. 1I, multiple second grooves 16 are formed on the bottom surface of the wafer 10 by sawing the bottom surface of the wafer 10 by a wafer dicing blade along the exposed parts of the upper encapsulant layer 14 on the bottom surface of the wafer 10. A vertical sawing depth (along the Z-axis) of each second groove 16 is a preset value, such that the second grooves 16 are not formed through the wafer 10. The parts of the upper encapsulant layer 14 filled in the first grooves 11 are exposed in the second grooves 16 respectively. In addition, the method to form the second grooves 16 is not limited to the use of the wafer dicing blade. For example, the second grooves 16 could be formed by etching, laser, and so on.

With reference to FIG. 1I, each second groove 16 and each first groove 11 have different widths. The width W2 of the second groove 16 and the width W1 of the first groove 11 are determined by the thicknesses of the wafer dicing blades. W2 is not equal to W1. As shown in FIG. 1I, the width W2 of the second groove 16 is wider than the width W1 of the first groove 11. In another embodiment, the width W2 of the second groove 16 could be narrower than the width W1 of the first groove 11. Besides, like the distribution of the first grooves 11 as mentioned above, the distribution of the second grooves 16 as a whole on the bottom surface of the wafer 10 corresponds to the X-axis scribe lines L1 and the Y-axis scribe lines L2 to form a grid pattern.

With reference to FIG. 1J, the second grooves 16 are filled with resin. Besides, the resin is also formed on the bottom surface of the wafer 10. The resin can be formed by film-laminating, printing, coating, dispensing, and so on. The resin will be solidified and become a rear encapsulant layer 17. The rear encapsulant layer 17 covers the bottom surface of the wafer 10. Parts of the rear encapsulant layer 17 filled in the second grooves 16 are respectively connected to the parts of the upper encapsulant layer 14 filled in the first grooves 11. As a result, the rear encapsulant layer 17 and the upper encapsulant layer 14 can be stably engaged with each other. Besides, each semiconductor unit 100 is individually encapsulated by the rear encapsulant layer 17 and the upper encapsulant layer 14.

Figures 1K, 1L:
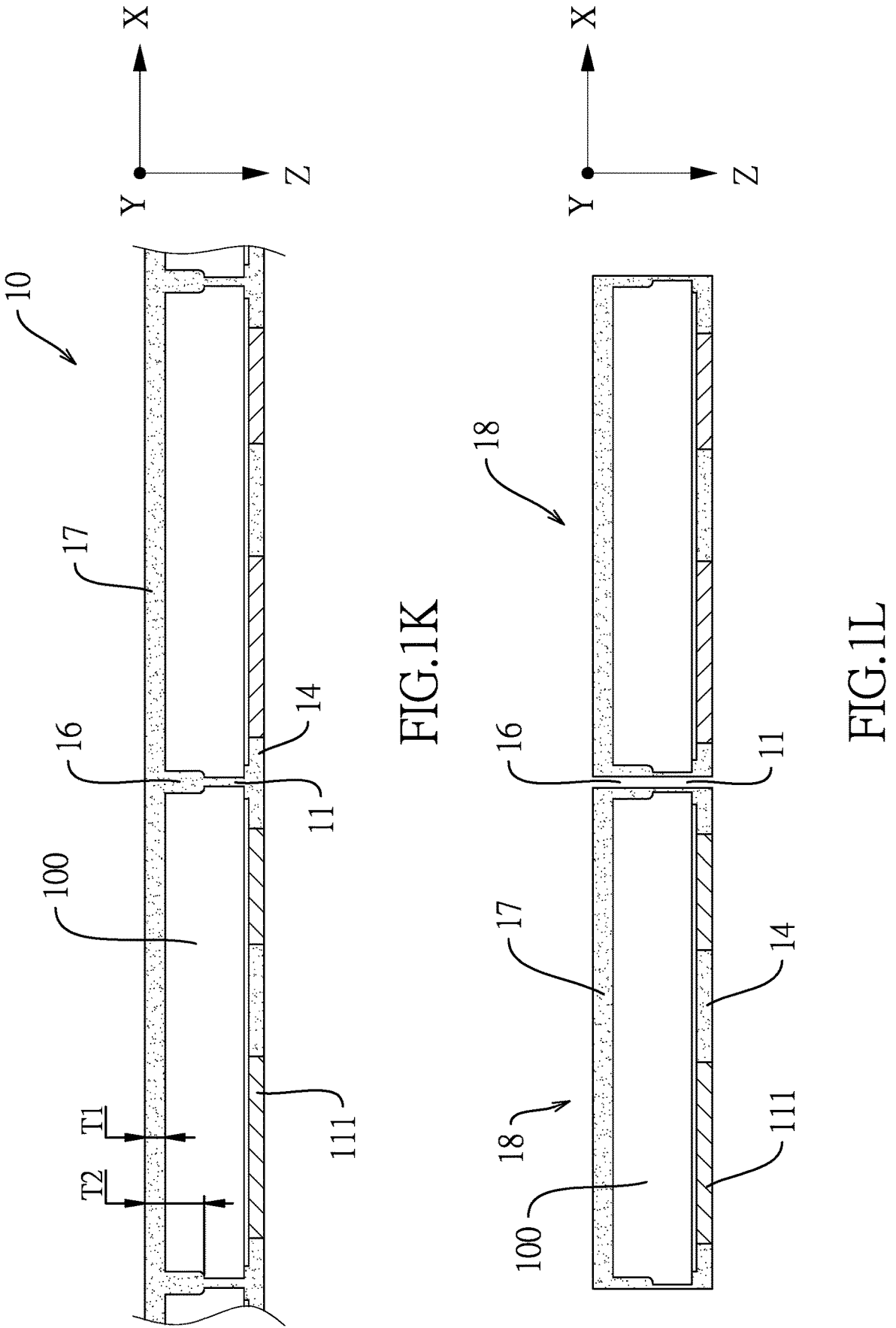

With reference to FIG. 1K and FIG. 1J, the second carrier board 15 is detached from the wafer 10 via the tape 150.

With reference to FIG. 1L, a singulation process is to saw through the rear encapsulant layer 17 and the upper encapsulant layer 14 along the first grooves 11 and the second grooves 16 in the direction of Z-axis, namely, to cut the positions between adjacent semiconductor units 100 to obtain multiple WLP devices 18.

In an embodiment of the singulation process, a wafer dicing blade can be put on the surface of the rear encapsulant layer 17 to saw. With reference to FIG. 1K, the thickness T1 of a part of the rear encapsulant layer 17 which covers the bottom surface of the wafer 10 may be lower than or equal to 100 micrometers ($\mu$m), such as 25 $\mu$m or 40 $\mu$m. Such thickness T1 is lower than the length T2 of another part of the rear encapsulant layer 17 which is filled in each second groove 16. By observing the color of the surface of the rear encapsulant layer 17, the parts of the rear encapsulant layer 17 which are filled in the second grooves 16 are darker than the parts of the rear encapsulant layer 17 which cover the semiconductor units 100. The distribution of the second grooves 16 corresponds to the X-axis scribe lines L1 and the Y-axis scribe lines L2. Therefore, a darker grid pattern can be recognized on the surface of the rear encapsulant layer 17, and the darker grid pattern corresponds to the positions of the X-axis scribe lines L1 and the Y-axis scribe lines L2. So the wafer dicing blade can be put on the surface of the rear encapsulant layer 17 to saw through the rear encapsulant layer 17 and the upper encapsulant layer 14 along the second grooves 16 and the first grooves 11 in the direction of Z-axis, namely, to cut the positions between adjacent semiconductor units 100 to obtain the WLP devices 18.

In another embodiment of the singulation process, a wafer dicing blade can be put on the top surface of the upper encapsulant layer 14 to saw. As the top surfaces of the conductive bumps 111 are exposed from the upper encapsulant layer 14, the positions of the conductive bumps 111 can be recognized from the top surface of the upper encapsulant layer 14. Further, based on the positions of the conductive bumps 111, the distribution of the semiconductor units 100 as well as the X-axis scribe lines L1 and the Y-axis scribe lines L2 can be deduced and recognized. So the wafer dicing blade can be put on the top surface of the upper encapsulant layer 14 to saw through the upper encapsulant layer 14 and the rear encapsulant layer 17 along the first grooves 11 and the second grooves 16 in the direction of Z-axis, namely, to cut the positions between adjacent semiconductor units 100 to obtain the WLP devices 18.

2. Second Embodiment of the Packaging Process of the WLP Device of the Present Invention With reference to FIG. 2A, a wafer 20 is prepared, which can be referred to the foregoing first embodiment of the packaging process of the present invention. The wafer 20 has integrated circuits of multiple semiconductor units 200. Conductive bumps 211 are mounted on a top surface of the wafer 20 and respectively corresponding to the semiconductor units 200. The thickness of the wafer 20 may be smaller than the thickness of the wafer 10 of the foregoing first embodiment.

Figures 2A, 2B:
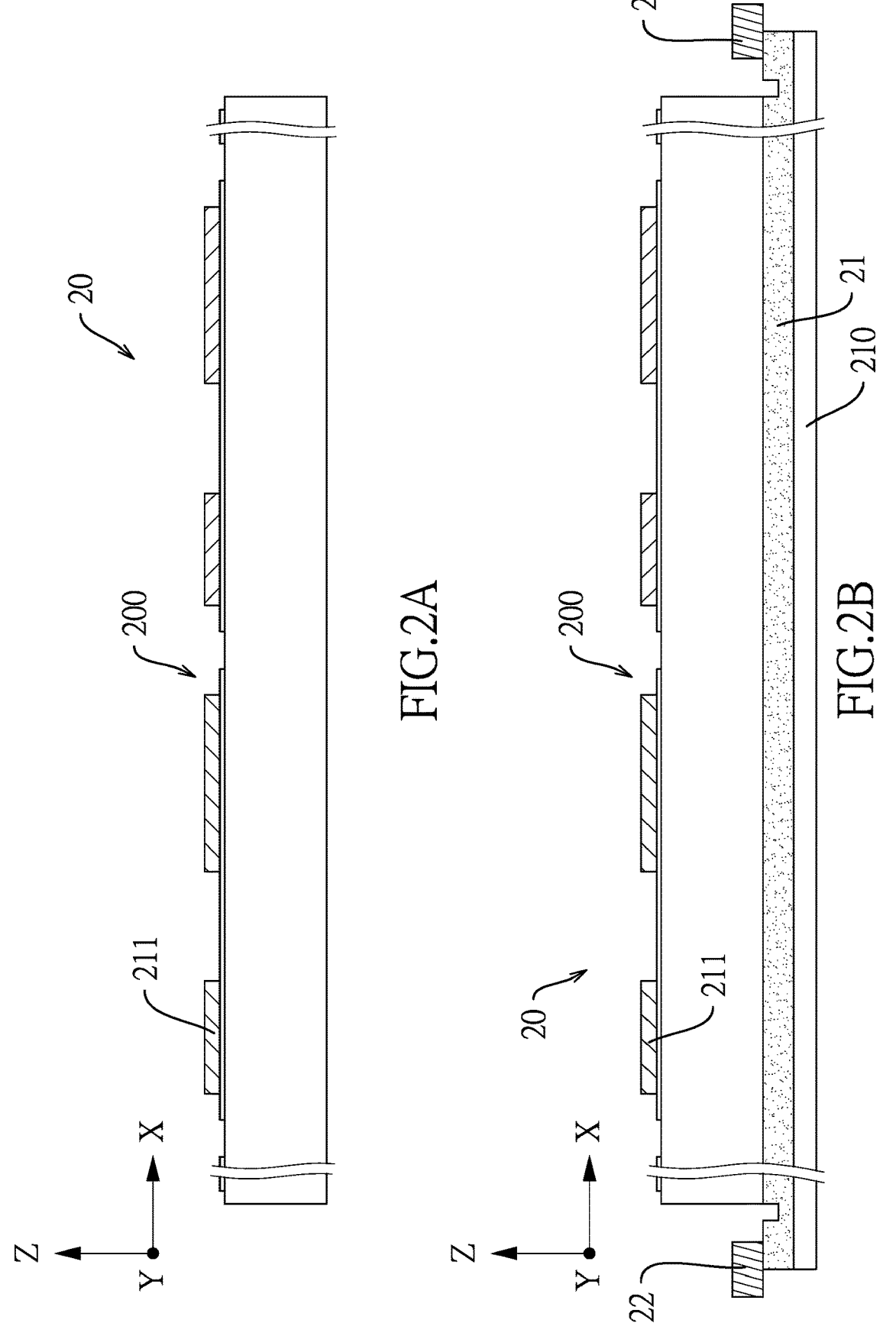
FIGS. 2A to 2K are schematic diagrams showing a second embodiment of a packaging process of the wafer-level-package device of the present invention.

With reference to FIG. 2B, the bottom surface of the wafer 20 is mounted on a rear encapsulant layer 21 which is attached on a sawing film 210. The rear encapsulant layer 21 may be made by resin. The wafer 20, the rear encapsulant layer 21, and the sawing film 210 are disposed on a frame 22 to go through the following packaging processes.

Figures 2C, 2D:
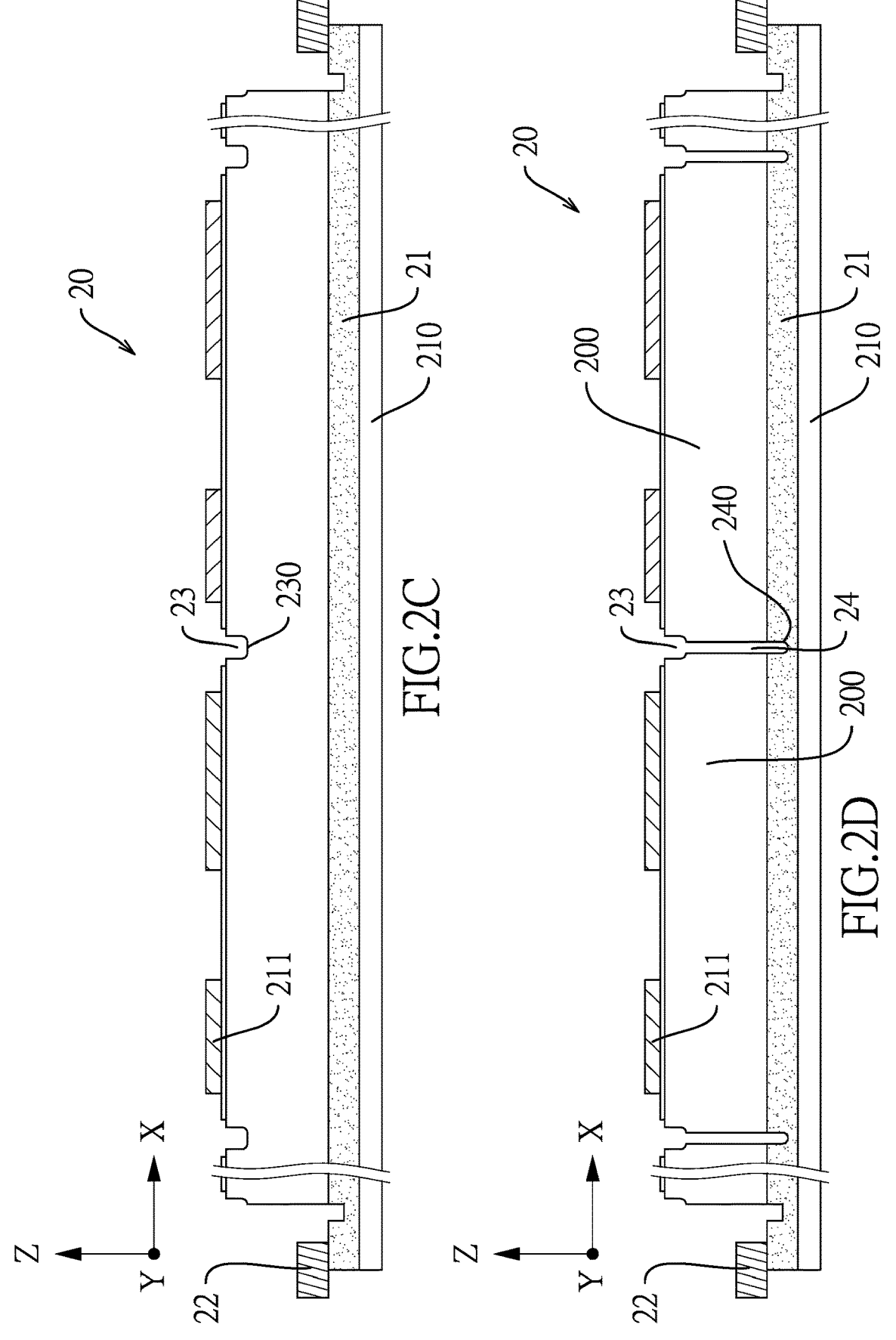

With reference to FIG. 2C, multiple first grooves 23 are formed on the top surface of the wafer 20 by sawing the top surface of the wafer 20 along the X-axis scribe lines L1 and the Y-axis scribe lines L2, so the first grooves 23 cut across each other. The first grooves 23 are not formed through the wafer 20. In other words, each first groove 23 has a bottom surface 230 located within the wafer 20. The distribution of the first grooves 23 can be referred to the foregoing first embodiment of the packaging process of the present invention. In brief, to saw the wafer 20 along the X-axis scribe lines L1 and the Y-axis scribe lines L2 respectively can form the first grooves 23 that are cut across each other. A vertical sawing depth (along the Z-axis) of each first groove 23 is a preset value.

With reference to FIG. 2D, the wafer 20 is further sawed from the bottom surfaces 230 (as shown in FIG. 2C) of the first grooves 23 respectively toward the bottom surface of the wafer 20 to form multiple second grooves 24. A vertical sawing depth (along the Z-axis) of each second groove 24 is a preset value, such that the second grooves 24 will be formed through the wafer 20 to expose the rear encapsulant layer 21, but the second grooves 24 will not be formed through the rear encapsulant layer 21. Namely, each second groove 24 has a bottom surface 240 located within the rear encapsulant layer 21. At that time, the semiconductor units 200 are separated from each other. So each semiconductor unit 200 is as a die. The width of the second groove 24 is smaller than the width of the first groove 23. The widths of the first groove 23 and the second groove 24 are determined by the thicknesses of the wafer dicing blades.

Then, the first grooves 23 and the second grooves 24 are filled with an upper encapsulant layer. Besides, the upper encapsulant layer is also formed on the top surface of the wafer 20. The top surface of the upper encapsulant layer may be flush with, or not flush with, the top surfaces of the conductive bumps 211. Parts of the upper encapsulant layer filled in the second grooves 24 are respectively connected to the rear encapsulant layer 21 exposed in the second grooves 24. As a result, the rear encapsulant layer 21 and the upper encapsulant layer can be stably engaged with each other. Each semiconductor unit 200 is individually encapsulated by the rear encapsulant layer 21 and the upper encapsulant layer. The embodiments to form the upper encapsulant layer are described as follows.

Figure 2E:
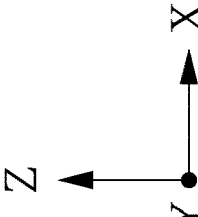
Figure 2F:
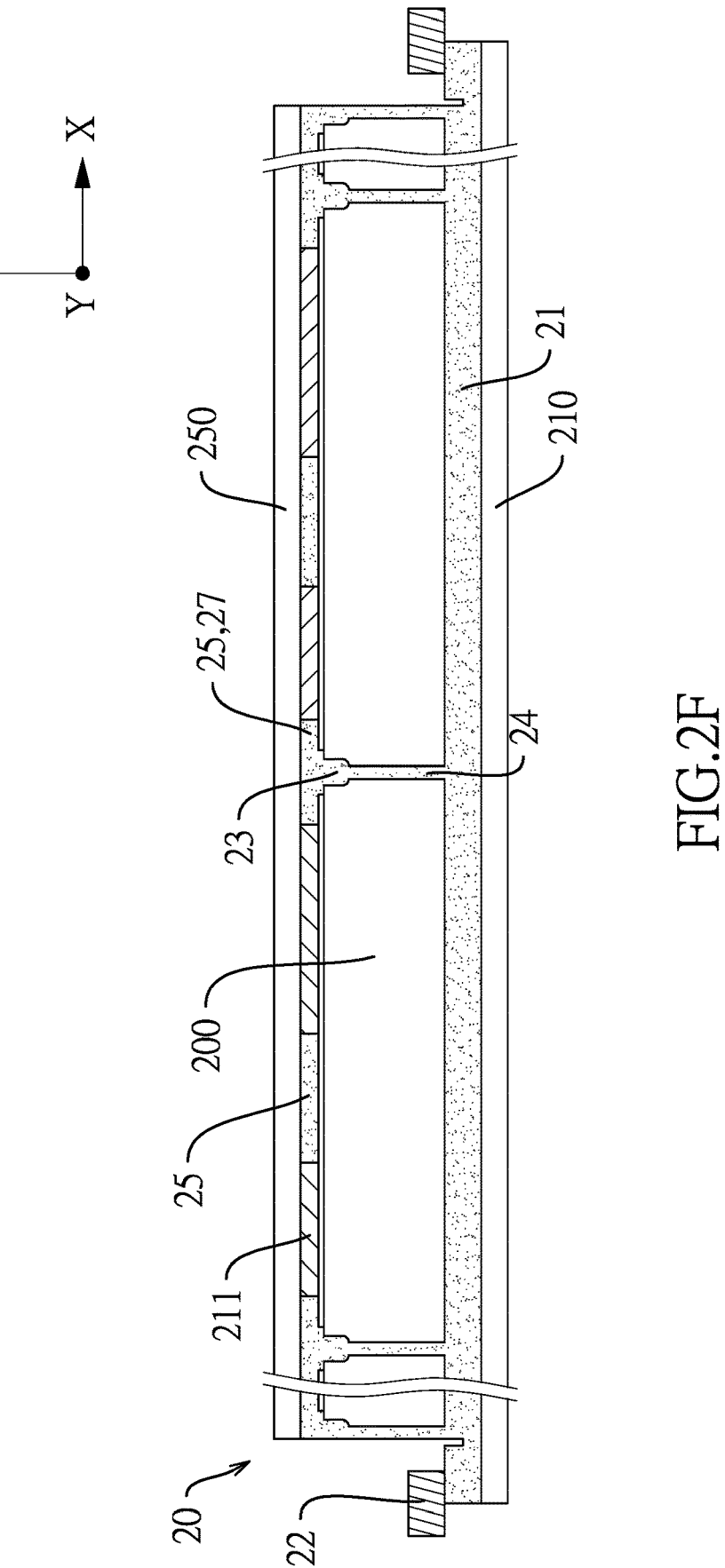

In an embodiment to form the upper encapsulant layer, with reference to FIG. 2E, a fluid encapsulant material 25 attached on a release film 250 is prepared. The fluid encapsulant material 25 may be resin. With reference to FIG. 2F, the fluid encapsulant material 25 may be held above the top surface of the wafer 20, and then the wafer 20 can be shifted to the fluid encapsulant material 25 until the top surfaces of the conductive bumps 211 are attached on the surface of the release film 250. So, the fluid encapsulant material 25 between the top surfaces of the conductive bumps 211 and the release films 250 will be squeezed out. Besides, the fluid encapsulant material 25 also flows into the first grooves 23 and the second grooves 24, such that the first grooves 23 and the second grooves 24 are filled with the fluid encapsulant material 25. As a whole, the fluid encapsulant material 25 is formed on the top surface of the wafer 20 and filled in the first grooves 23 and the second grooves 24 to be connected to the rear encapsulant layer 21. The fluid encapsulant material 25 will be solidified and become the upper encapsulant layer 27. As mentioned above, because the top surfaces of the conductive bumps 211 are attached on the surface of the release film 250, the top surfaces of the conductive bumps 211 are flush with the top surface of the upper encapsulant layer 27. Then, the release film 250 will be detached.

Figure 2G:
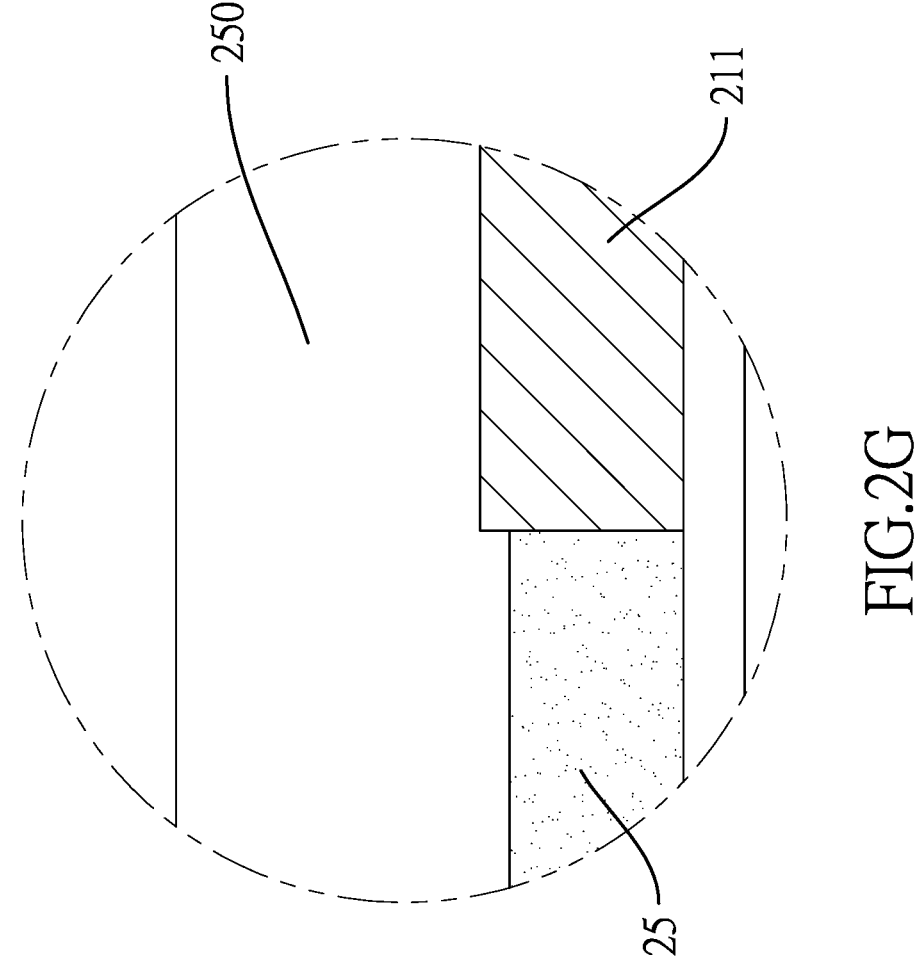

Furthermore, because the release film 250 is elastic, with reference to FIG. 2G, when the top surfaces of the conductive bumps 211 are attached on the surface of the release film 250 as mentioned above, the top surfaces of the conductive bumps 211 can be further embedded into the release film 250 by a further force. By doing so, the effect to squeeze out the fluid encapsulant material 25 between the top surfaces of the conductive bumps 211 and the release films 250 is better. The fluid encapsulant material 25 as shown in FIG. 2G will be solidified and become the upper encapsulant layer 27, such that the top surfaces of the conductive bumps 211 protrude from the top surface of the upper encapsulant layer 27. Hence, the top surfaces of the conductive bumps 211 are not flush with the top surface of the upper encapsulant layer 27. Then, the release film 250 will be detached.

Figures 2H, 2I:
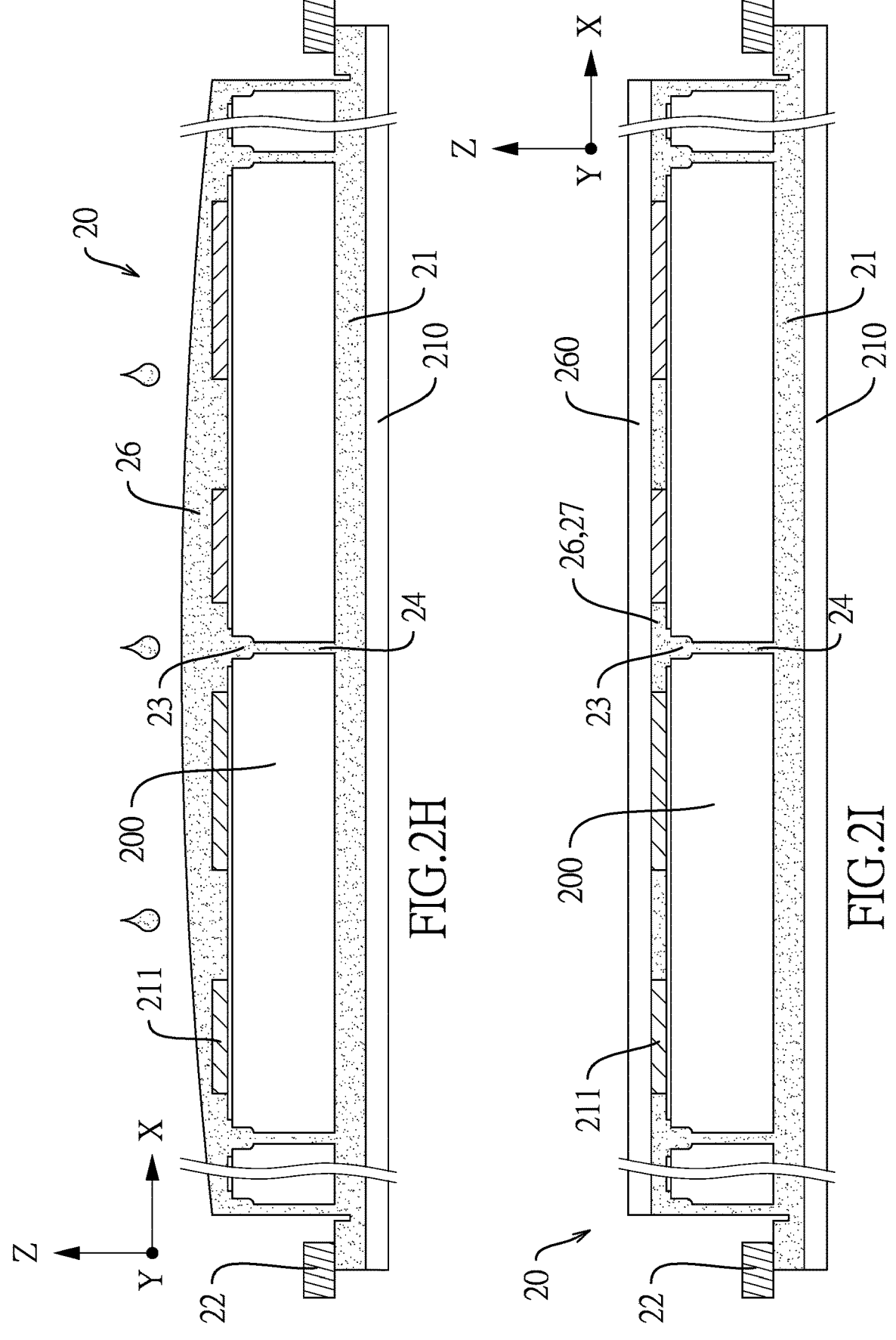

In another embodiment to form the upper encapsulant layer, with reference to FIG. 2H, the first grooves 23 and the second grooves 24 of the wafer 20 are filled with a fluid encapsulant material 26. Besides, the fluid encapsulant material 26 is also formed on the top surface of the wafer 20 and the top surfaces of the conductive bumps 211. The fluid encapsulant material 26 can be formed by coating, dispensing, and so on. Then, with reference to FIG. 2I, a release film 260 is attached on the top surfaces of the conductive bumps 211 to squeeze out the fluid encapsulant material 26 between the top surfaces of the conductive bumps 211 and the release films 260. Then, the release film 260 will be detached. The fluid encapsulant material 26 will be solidified and become the upper encapsulant layer 27.

Figures 2J, 2K:
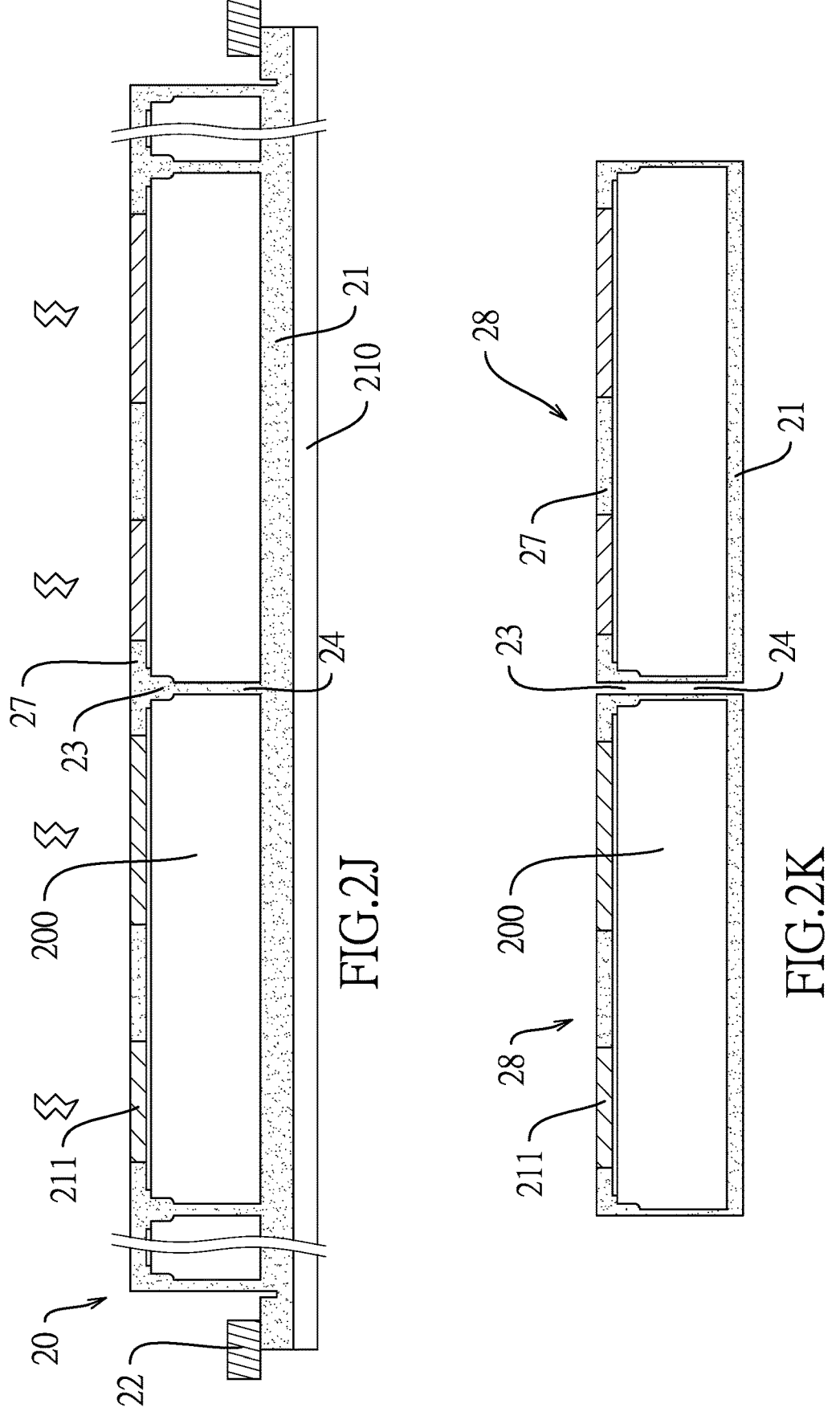

With reference to FIG. 2J, after the upper encapsulant layer 27 is formed, a surface cleaning process may be performed to remove impurities from the top surfaces of the conductive bumps 111 by plasma or laser.

With reference to FIG. 2K, a singulation process is to saw through the upper encapsulant layer 27 and the rear encapsulant layer 21 along the first grooves 23 and the second grooves 24 in the direction of Z-axis to obtain multiple WLP devices 28. This singulation process can be referred to the foregoing first embodiment of the packaging process of the present invention.

3. Structure of the WLP Device of the Present Invention

Figure 3:
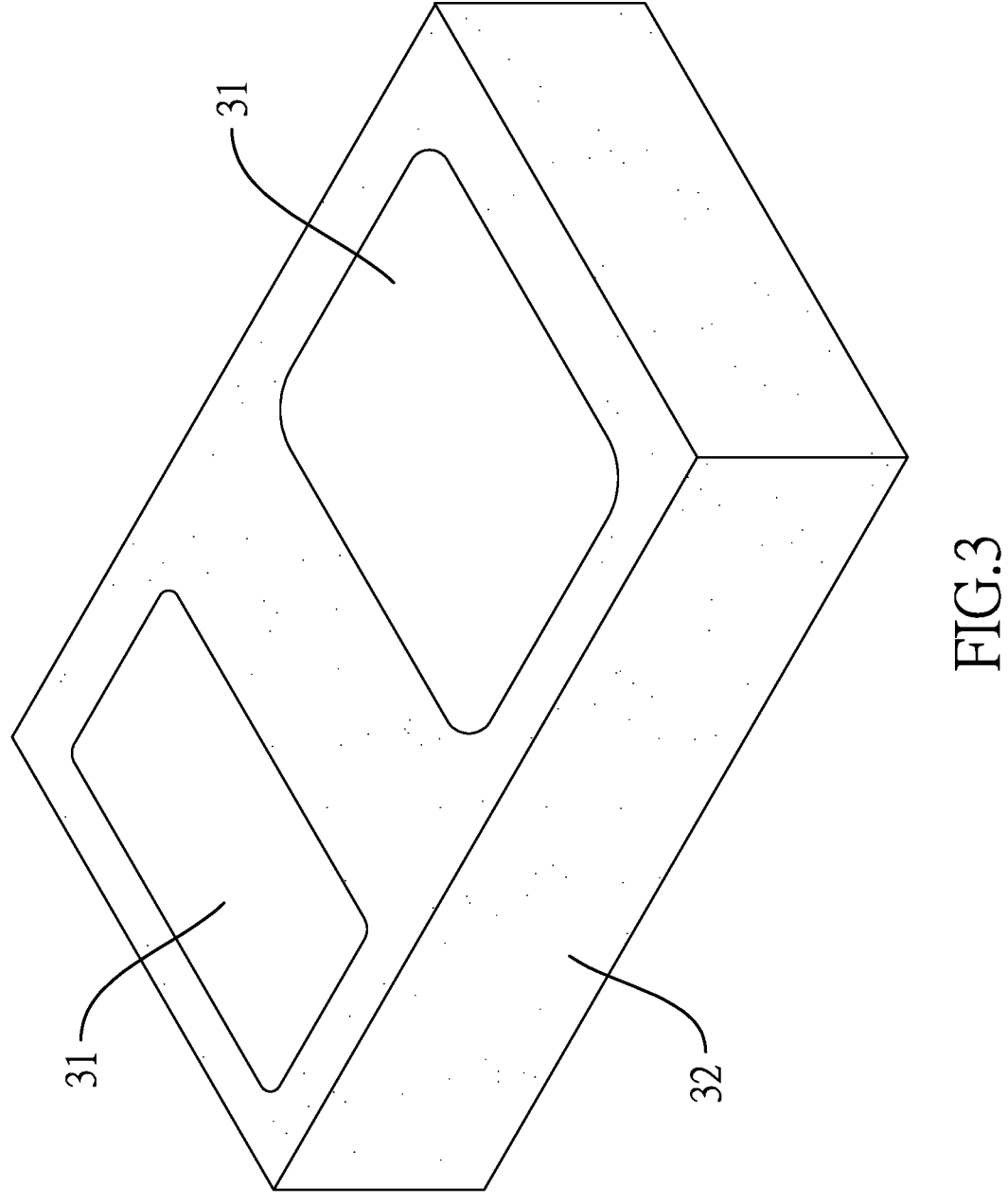
FIG. 3 is a schematic perspective view of an embodiment of the wafer-level-package device of the present invention.
Figures 4, 5:
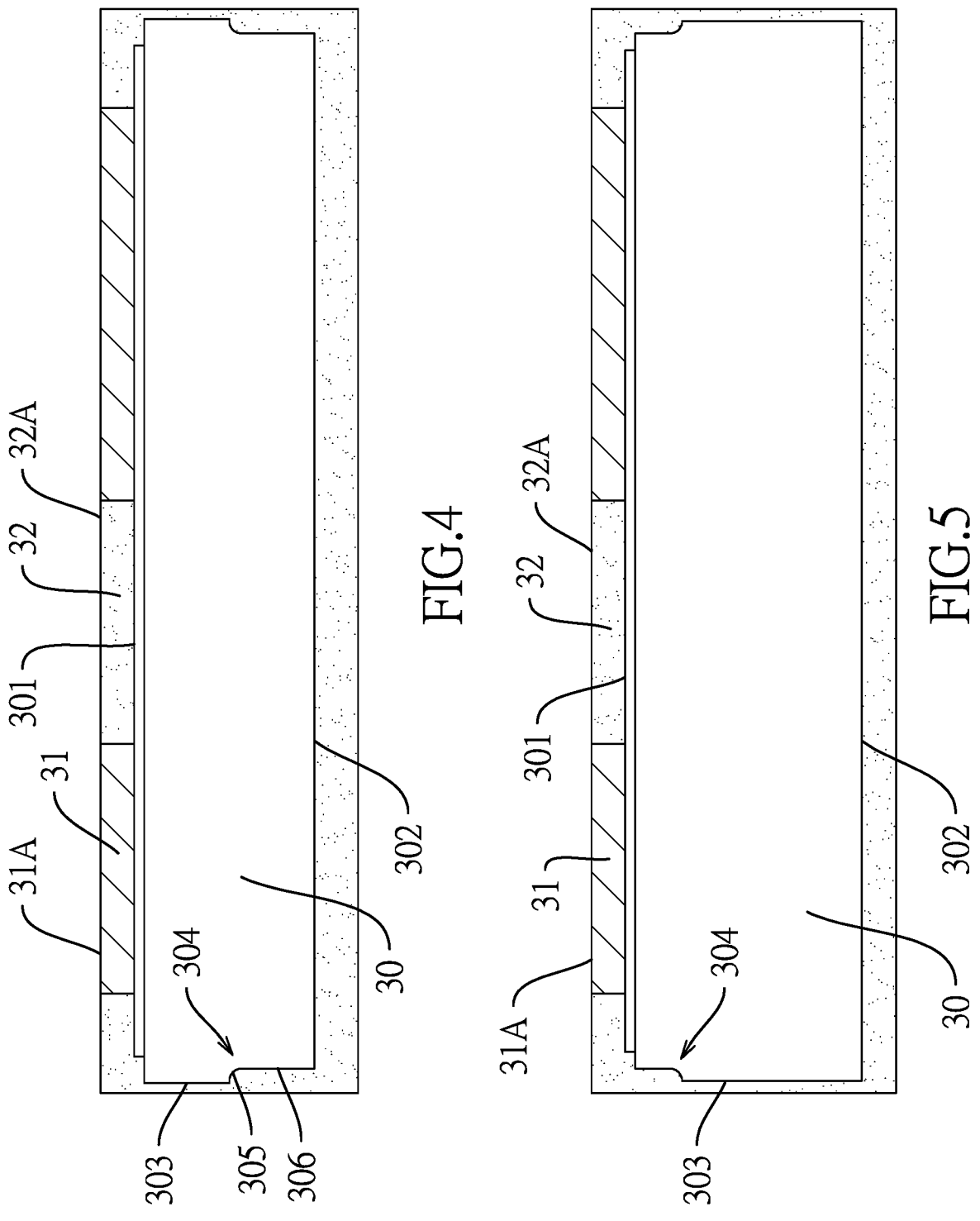
FIG. 4 is a cross-sectional view of an embodiment of the wafer-level-package device of the present invention.
FIG. 5 is a cross-sectional view of another embodiment of the wafer-level-package device of the present invention.
Figures 6, 7:
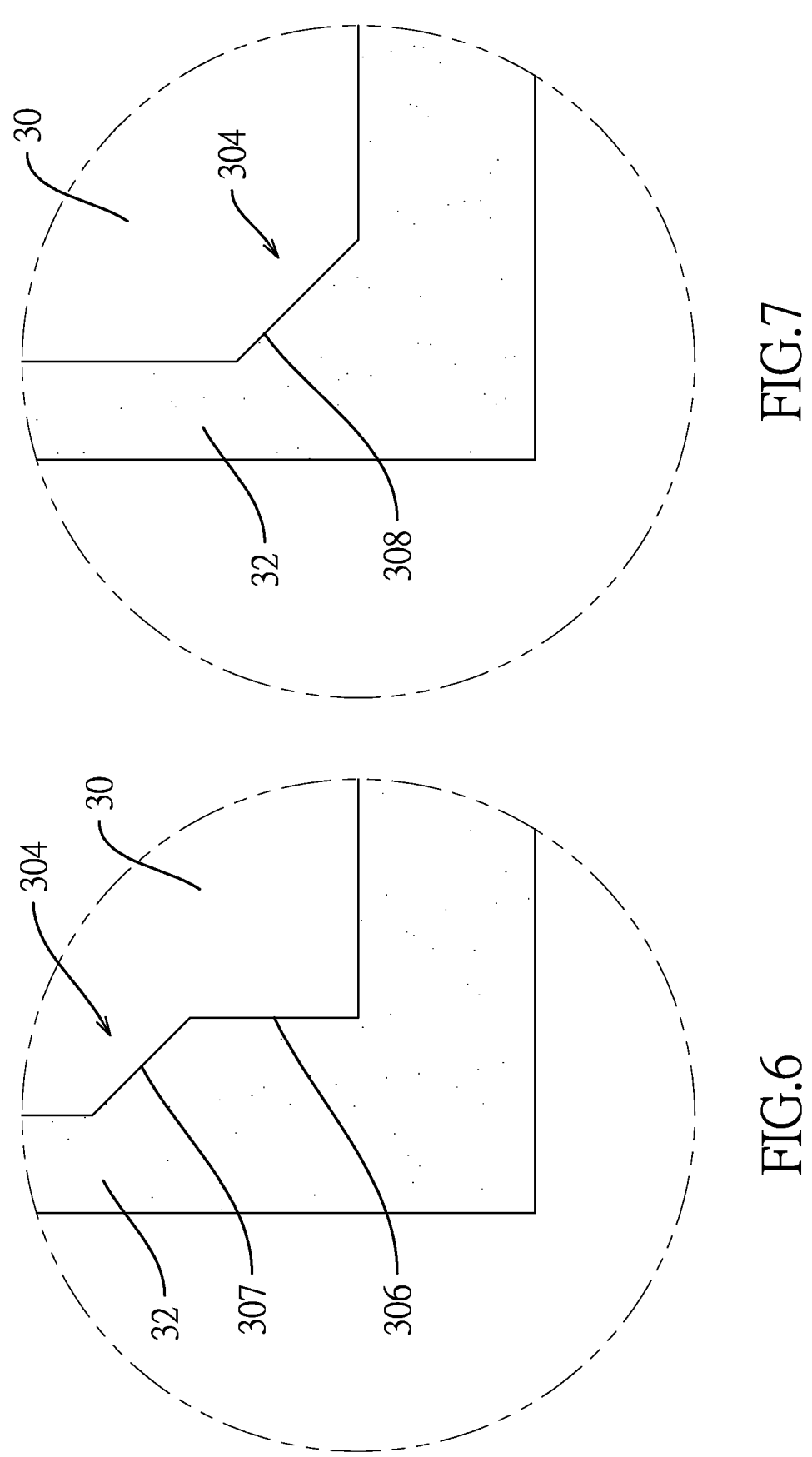
FIG. 6 is a partial enlarged view showing a cavity of the wafer-level-package device of the present invention.
FIG. 7 is a partial enlarged view showing another cavity of the wafer-level-package device of the present invention.

With reference to FIG. 3 and FIG. 4, the WLP device of the present invention comprises a die 30, multiple conductive bumps 31, and a protection layer 32. The die 30 has the integrated circuits of the above-mentioned semiconductor units 100, 200. The die 30 has a top surface 301, a bottom surface 302, and a peripheral side wall 303. A cavity 304 is formed on the peripheral side wall 303 of the die 30 and around the die 30. The position of the cavity 304 is determined by the above-mentioned packaging processes. For example, the cavity 304 may extend upward from the bottom surface 302 of the die 30, which is originated from the second grooves 16 as shown in FIG. 1I, such that the bottom part of the die 30 is thinner than the top part of the die 30. Or in another embodiment, with reference to FIG. 5, the cavity 304 may extend downward from the top surface 301 of the die 30, which is originated from the first grooves 23 as shown in FIG. 2C, such that the top part of the die 30 is thinner than the bottom part of the die 30. Moreover, corresponding to the shape of the cutting surface of the wafer dicing blade, as shown in FIG. 4, a concave surface of the cavity 304 includes a curved surface 305 and a vertical surface 306, wherein the vertical surface 306 is perpendicular to the X-Y plane. Or, as shown in FIG. 6, the concave surface of the cavity 304 includes an inclined surface 307 and a vertical surface 306. Or, as shown in FIG. 7, the concave surface of the cavity 304 is an inclined surface 308.

Figures 8A, 8B:
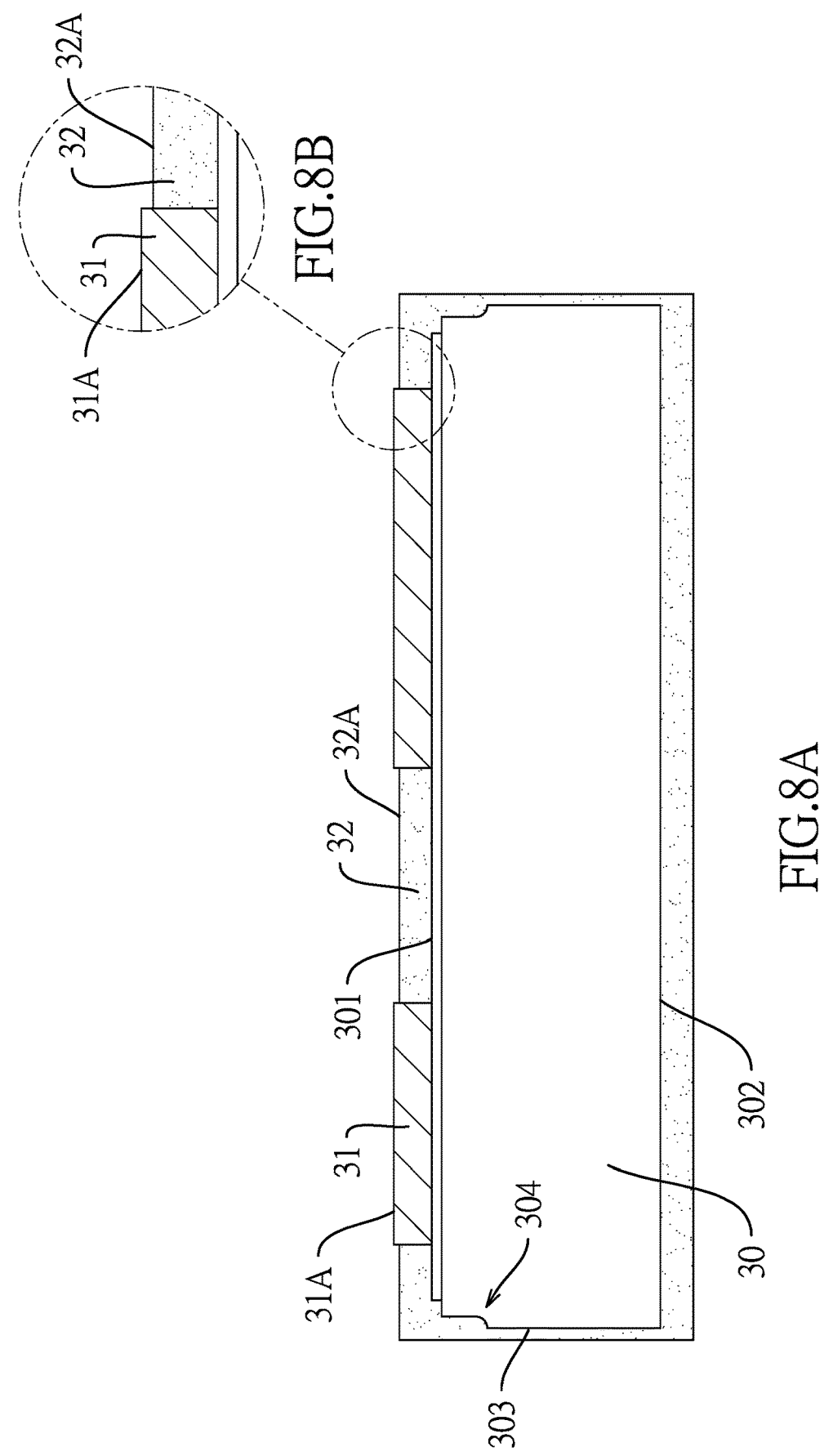
FIG. 8A is a cross-sectional view of another embodiment of the wafer-level-package device of the present invention.
FIG. 8B is a partial enlarged view of FIG. 8A.
Figure 9A:
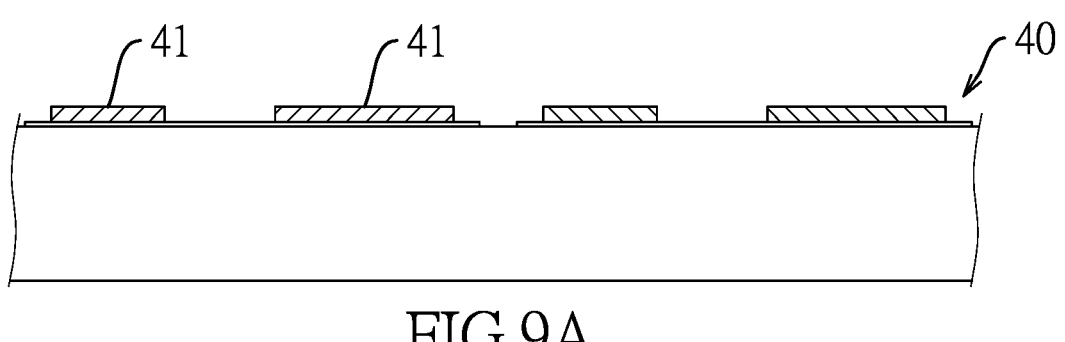
FIGS. 9A to 9C are schematic diagrams showing a conventional process of dicing a wafer to obtain multiple dies.
Figure 9B:
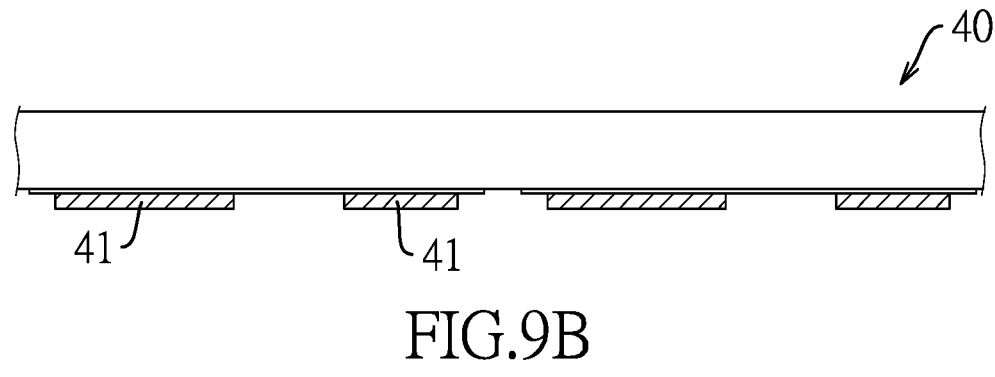
Figure 9C:
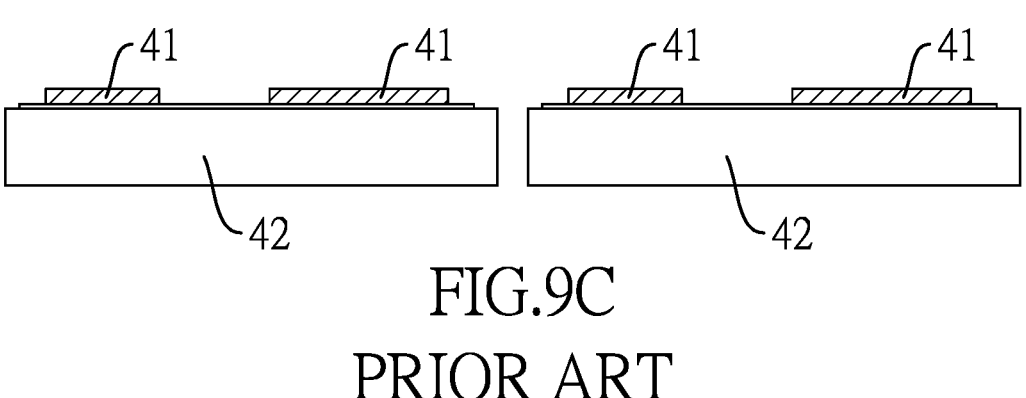
Figures 9D, 9E:
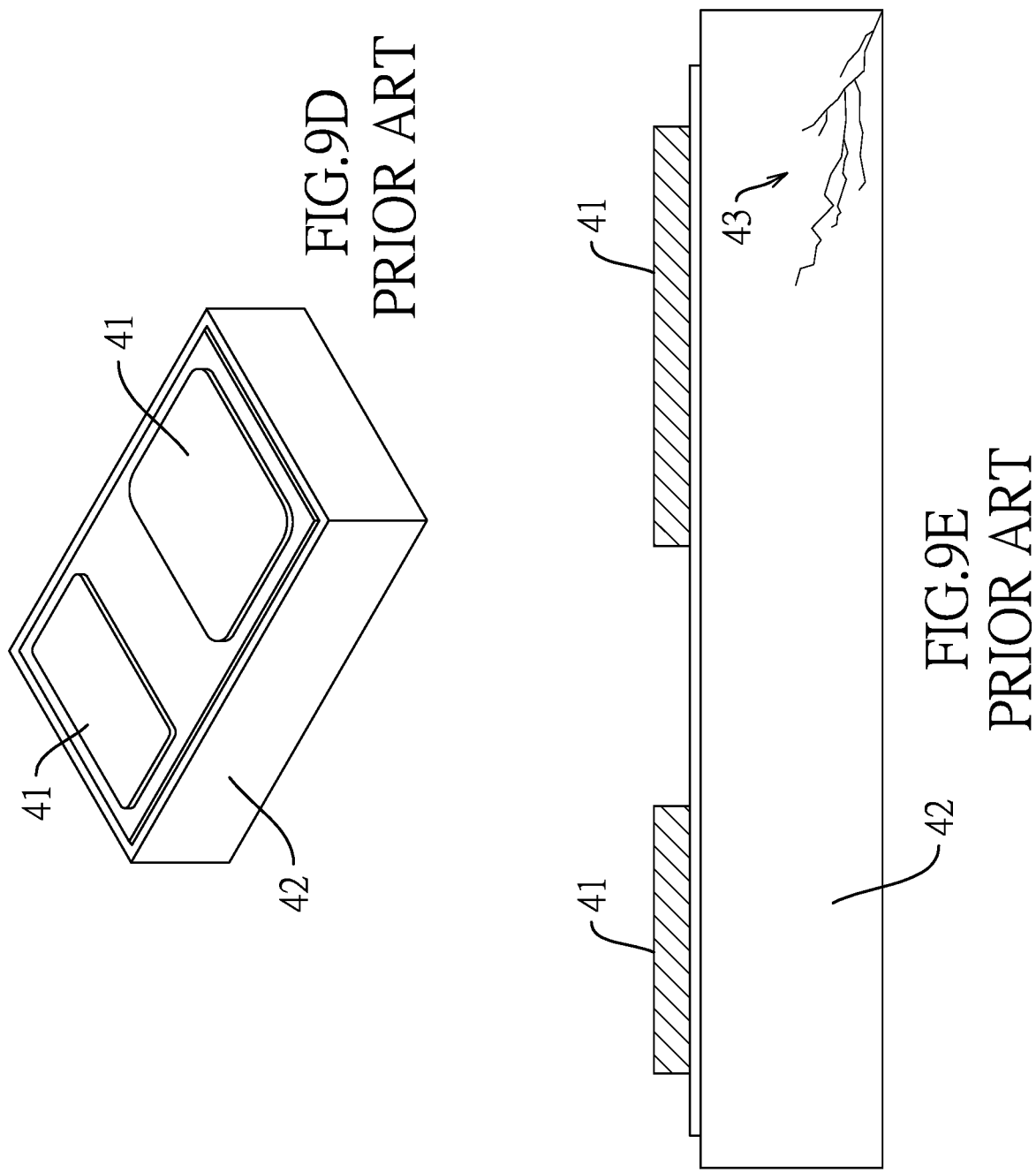
FIG. 9D is a schematic perspective view of a conventional die.
FIG. 9E is a side view of the conventional die having cracks.

The conductive bumps 31 are mounted on at least one of the top surface 301 and the bottom surface 302 of the die 30. In the embodiments of the present invention, the conductive bumps 31 are just mounted on the top surface 301 of the die 30 as an example. The protection layer 32 covers the top surface 301, the bottom surface 302, and the peripheral side wall 303 of the die 30, the cavity 304, and the conductive bumps 31. The conductive bumps 31 are exposed from the protection layer 32. As shown in FIG. 4 and FIG. 5, the top surface 32A of the protection layer 32 is flush with the top surface 31A of the conductive bump 31. In another embodiment, with reference to FIG. 8A and FIG. 8B, the top surface 32A of the protection layer 32 is not flush with the top surface 31A of the conductive bump 31, wherein the top surface 31A of the conductive bump 31 protrude from the top surface 32A of the protection layer 32. The protection layer 32 is formed by the combination of the upper encapsulant layer 14,27 and the rear encapsulant layer 17,21 as mentioned above. The rear encapsulant layer 17, 21 covers the bottom surface 302 of the die 30.

In conclusion, the upper encapsulant layer 14, 27 and the rear encapsulant layer 17, 21 are connected to each other via the first grooves 11, 23 and the second grooves 16, 24. So the upper encapsulant layer 14, 27 and the rear encapsulant layer

17, 21 can be stably engaged with each other. The protection layer 32 is formed by the combination of the upper encapsulant layer 14, 27 and the rear encapsulant layer 17, 21. Therefore, the structural stability of the protection layer 32 is ensured. In addition, with reference to FIG. 4 and FIG. 5, the die 30 and the conductive bumps 31 are covered by the protection layer 32. The protection layer 32 can absorb and buffer the collision or shock from surroundings. Moreover, the contact area between the protection layer 32 and the die 30 is enlarged according to the concave surface of the cavity 304 of the peripheral side wall 303, such that the combination of the protection layer 32 and the die 30 is much more stable.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A wafer-level-package device with peripheral side wall protection comprising:

a die having a top surface, a bottom surface, and a peripheral side wall; wherein a cavity is formed on the peripheral side wall of the die and around the die;

multiple conductive bumps mounted on at least one of the top surface and the bottom surface of the die; and a protection layer formed by a combination of an upper encapsulant layer and a rear encapsulant layer and covering the top surface, the bottom surface, and the peripheral side wall of the die, the cavity, and the multiple conductive bumps; wherein the multiple conductive bumps are exposed from the protection layer; wherein top surfaces of the multiple conductive bumps protrude from a top surface of the protection layer; wherein the rear encapsulant layer covers the bottom surface of the die.

2. The wafer-level-package device as claimed in claim 1, wherein the cavity extends downward from the top surface of the die.

3. The wafer-level-package device as claimed in claim 1, wherein the cavity extends upward from the bottom surface of the die.

4. The wafer-level-package device as claimed in claim 1, wherein a concave surface of the cavity is an inclined surface.

5. The wafer-level-package device as claimed in claim 1, wherein a concave surface of the cavity includes an inclined surface and a vertical surface.

6. The wafer-level-package device as claimed in claim 1, wherein a concave surface of the cavity includes a curved surface and a vertical surface.

* * * * *